（12）United States Patent
Yonemitsu et al.

(10) Patent No.: US 7,930,819 B2
(45) Date of Patent: Apr. 26, 2011

(54) COMPONENT SUPPLY UNIT AND SURFACE MOUNTER

(75) Inventors: Masanori Yonemitsu, Iwata (JP); Osamu Araki, Iwata (JP)

(73) Assignee: Yamaha Hatsudoki Kabushiki Kaisha (JP)

( * ) Notice: Subject to any disclaimer, the term of this patent is extended or adjusted under 35 U.S.C. 154(b) by 0 days.

(21) Appl. No.: 12/444,106

(22) PCT Filed: Oct. 3, 2007

(86) PCT No.: PCT/JP2007/069377
§ 371 (c)(1),
(2), (4) Date: Apr. 2, 2009

(87) PCT Pub. No.: WO2008/041725
PCT Pub. Date: Apr. 10, 2008

(65) Prior Publication Data
US 2009/0249615 A1    Oct. 8, 2009

(30) Foreign Application Priority Data
Oct. 3, 2006   (JP) ................................. 2006-271653

(51) Int. Cl.
*H01R 43/00* (2006.01)
(52) U.S. Cl. ............. 29/739; 29/740; 29/762; 29/426.3; 226/76; 414/416.04
(58) Field of Classification Search ............ 29/739–740, 29/741–742, 762, 426.3; 226/157, 148, 584, 226/76; 414/416.01–416.04, 811, 412
See application file for complete search history.

(56) References Cited

U.S. PATENT DOCUMENTS

| 4,810,154 | A |   | 3/1989 | Klemmer et al. |
| 5,299,902 | A | * | 4/1994 | Fujiwara et al. .......... 414/416.01 |
| 5,531,859 | A | * | 7/1996 | Lee et al. ...................... 156/584 |
| 6,162,007 | A | * | 12/2000 | Witte ...................... 414/416.01 |
| 6,652,706 | B1 |   | 11/2003 | MacNeil et al. |
| 7,052,564 | B2 | * | 5/2006 | Tandle et al. .................. 156/64 |
| 7,568,280 | B2 | * | 8/2009 | Zeng et al. ...................... 29/739 |

FOREIGN PATENT DOCUMENTS

| JP | 11-074689 | | 3/1999 |
| JP | 11-224996 | | 8/1999 |
| JP | 11 224996 A | | 8/1999 |
| JP | 2003-158397 A | | 5/2003 |
| JP | 2006-156514 A | | 6/2006 |
| WO | 00 38492 A1 | | 6/2000 |

OTHER PUBLICATIONS

The Extended European Search Report dated Jun. 24, 2010; Application No. Patent No. 07829116.8-2214/ 2079294 PCT/JP2007069377.

* cited by examiner

*Primary Examiner* — Minh Trinh
(74) *Attorney, Agent, or Firm* — Studebaker & Brackett PC; Donald R. Studebaker

(57) ABSTRACT

It is intended to allow for readily performing a cover tape setting operation. In the present invention, a tape guide 110 for guiding a component supply tape 35 includes a front guide section 120 provided with an open surface 128 opened on one side thereof in a continuous manner in a tape feed direction, so as to allow a cover tape 37 to be taken in and out relative to the front guide section 120 through the open surface 128. This configuration makes it possible to perform the setting operation for the cover tape 37 through given operational steps, under a condition that the tape guide 110 remains fixed to a component supply unit 40.

5 Claims, 15 Drawing Sheets

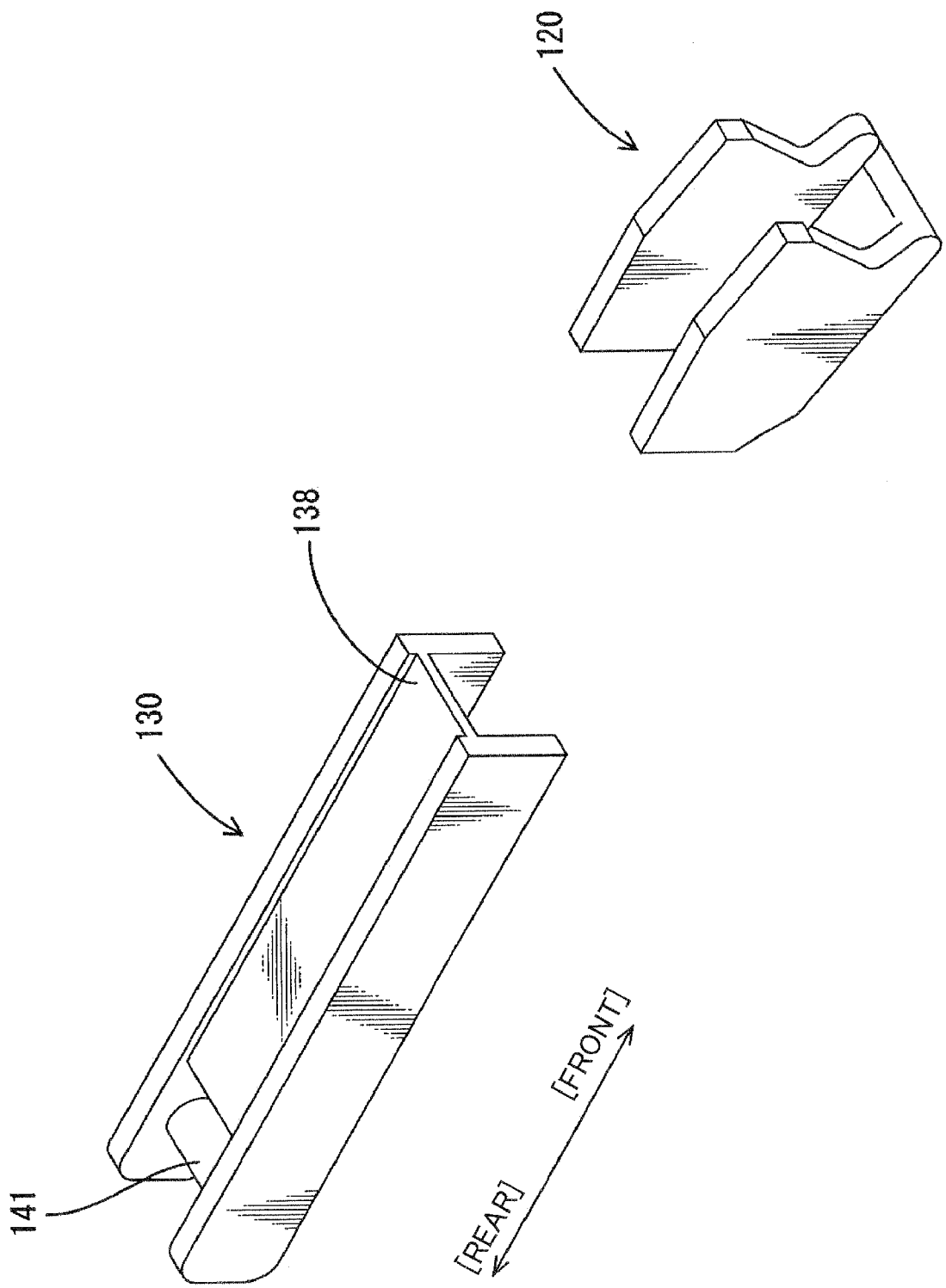

COMPONENT SUPPLY UNIT AND SURFACE MOUNTER

TECHNICAL FIELD

The present invention relates to a component supply unit for supplying components, such as ICs, using a tape as a carrier, and a surface mounter equipped therewith.

BACKGROUND ART

Heretofore, there has been known a tape feeder as one example of a unit for supplying components to a surface mounter.

The tape feeder is designed to feed out a tape having components stored therein at constant intervals, to a component supply position in a front portion of the feeder, while unreeling the tape from a reel. The component supply tape serving as a carrier comprises a carrier tape having component storage portions, and a cover tape attached to the carrier tape in such a manner as to cover the component storage portions. The cover tape takes on a function of pressing the components to prevent drop-off thereof until the component supply tape reaches the component supply position, wherein it is peeled off from the carrier tape in a vicinity of the component supply position.

In this type of tape feeder, in order to stably supply the components, a tape guide is provided in a vicinity of the component supply position to restrain a lateral displacement of the tape. For example, in a tape feeder disclosed in the following Patent Document, a first cover member and a second cover member are provided to facilitate restraint in position of the component supply tape.

[Patent Document 1] JP 11-224996A

Further, in the above type of tape feeder, there is a need for performing a cover tape setting operation when the reel is replaced. More specifically, a cover tape has to be turned in the rearward direction of the unit in a vicinity of the component supply position, and set to a take-up reel or the like. However, cover members are located frontward and rearward of the component supply position. Thus, if the cover members remain fixed, there occurs a situation where it is difficult to turn the cover tape.

For this reason, in the tape feeder disclosed in the Patent Document 1, the two covers provided frontward and rearward of the component supply position are opened by swingingly moving them upwardly, and then a setting operation for a carrier tape is performed. However, it takes a lot of time and effort to manually open and close the covers.

The present invention has been accomplished under the above circumstances, and it is an object of the present invention to allow for readily performing a cover tape setting operation.

DISCLOSURE OF THE INVENTION

This technical object is achieved by a component supply unit of the present invention having the following elements.

Specifically, the present invention provides a component supply unit which comprises: a feed-out device adapted to intermittently feed out a component supply tape toward a component supply position provided on a feed path extending in a given direction, wherein the component supply tape includes a carrier tape having components stored therein at constant intervals, and a cover tape attached to the carrier tape to prevent jump-out of the stored components; a guide device set up along the feed path and adapted to guide the component supply tape from widthwisely opposite sides thereof to keep a feed posture of the component supply tape in a normal posture; a turnaround portion set up above the feed path; and a take-in device adapted to take in the cover tape turned through the turnaround portion to peel off the cover tape from the carrier tape, during a course of feeding the component supply tape, wherein the guide device includes a downstream guide section located downstream of the component supply position in a tape feed direction and adapted to guide the component supply tape, and wherein the downstream guide section is provided with an open surface opened on one side thereof in a continuous manner in the tape feed direction, whereby the cover tape can be taken in and out relative to the downstream guide section through the open surface.

BRIEF DESCRIPTION OF DRAWINGS

FIG. 15 is a diagram showing another embodiment.

BEST MODE FOR CARRYING OUT THE INVENTION

First Embodiment

A first embodiment of the present invention will be described with reference to FIGS. 1 to 12.

1. General Configuration

Figure 1:
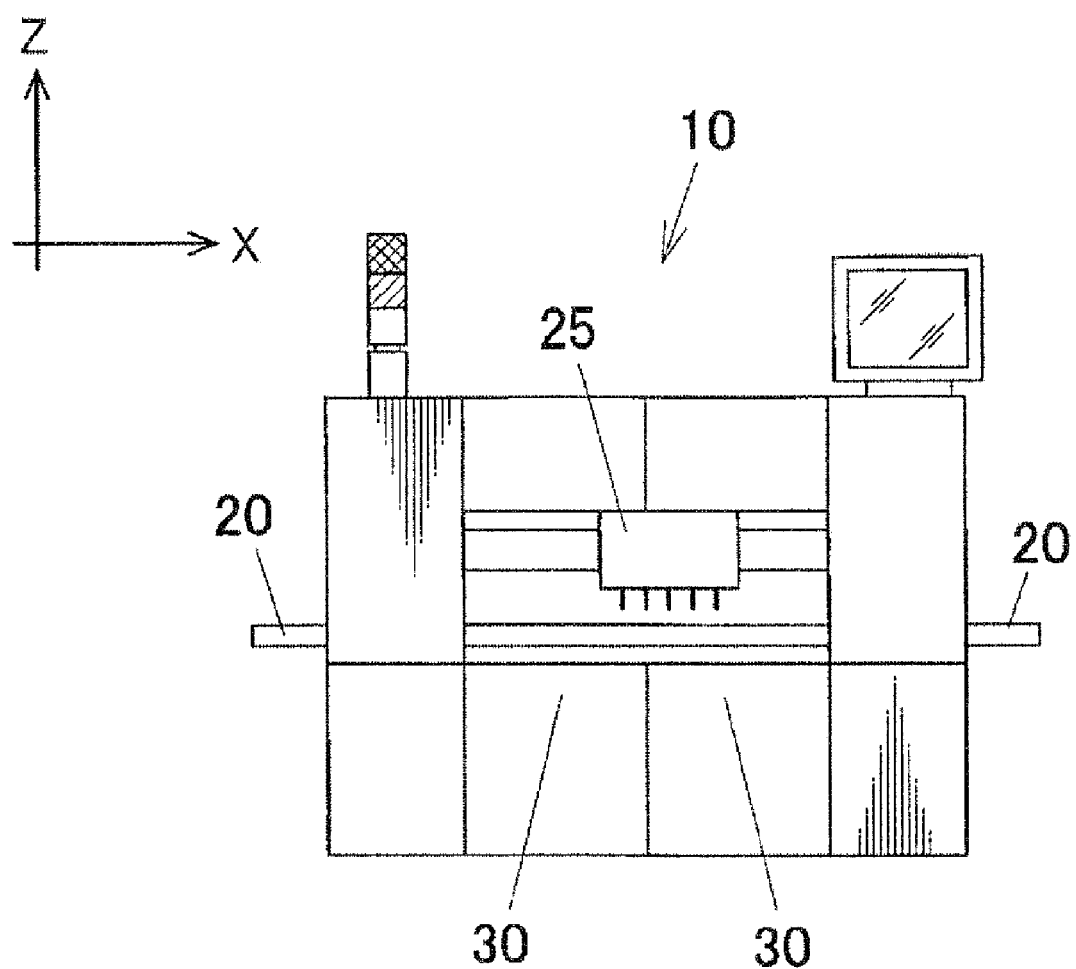
FIG. 1 is a front view illustrating a surface mounter according to a first embodiment of the present invention.
Figure 2:
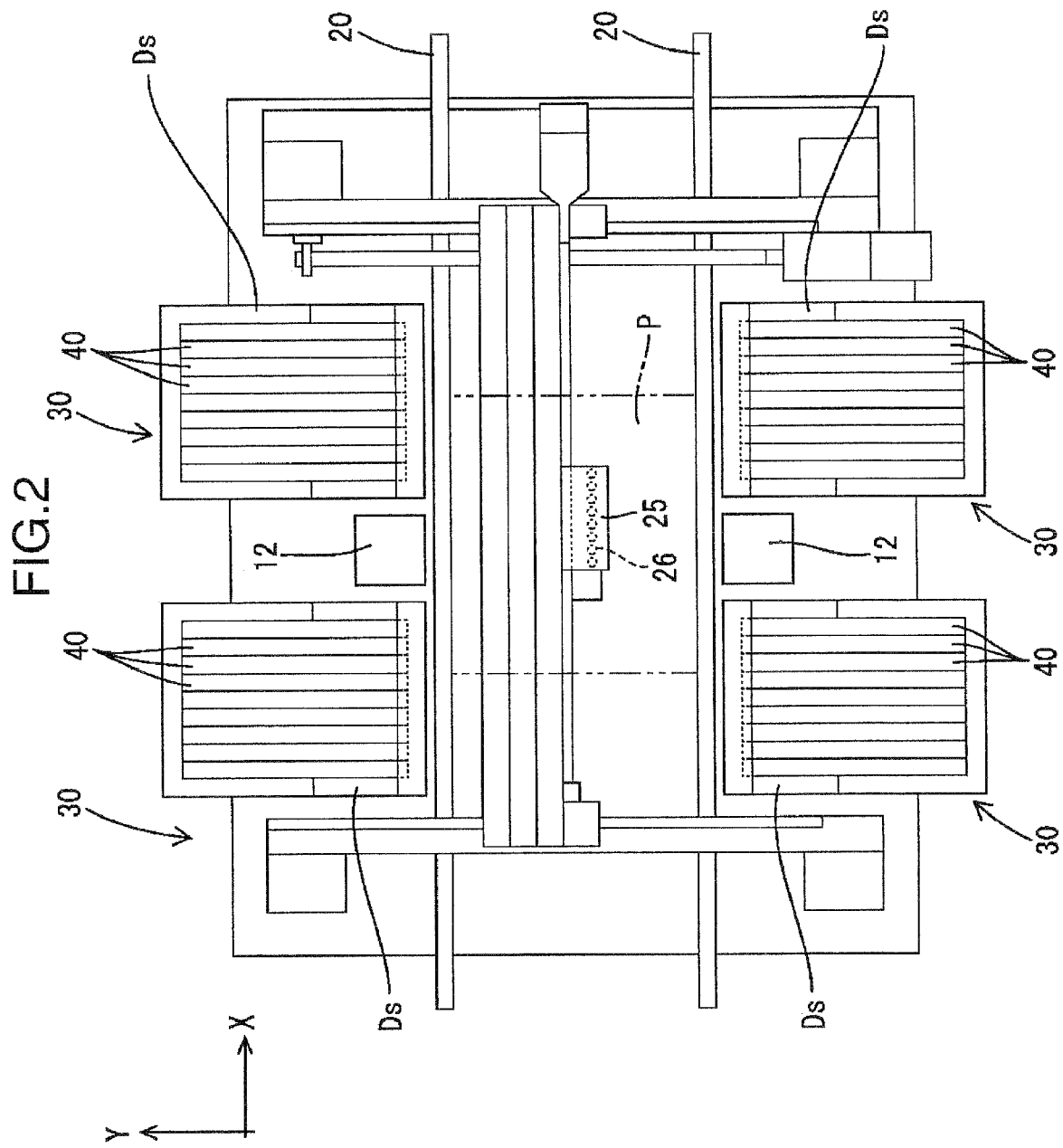
FIG. 2 is a top plan view of the surface mounter.
Figure 3:
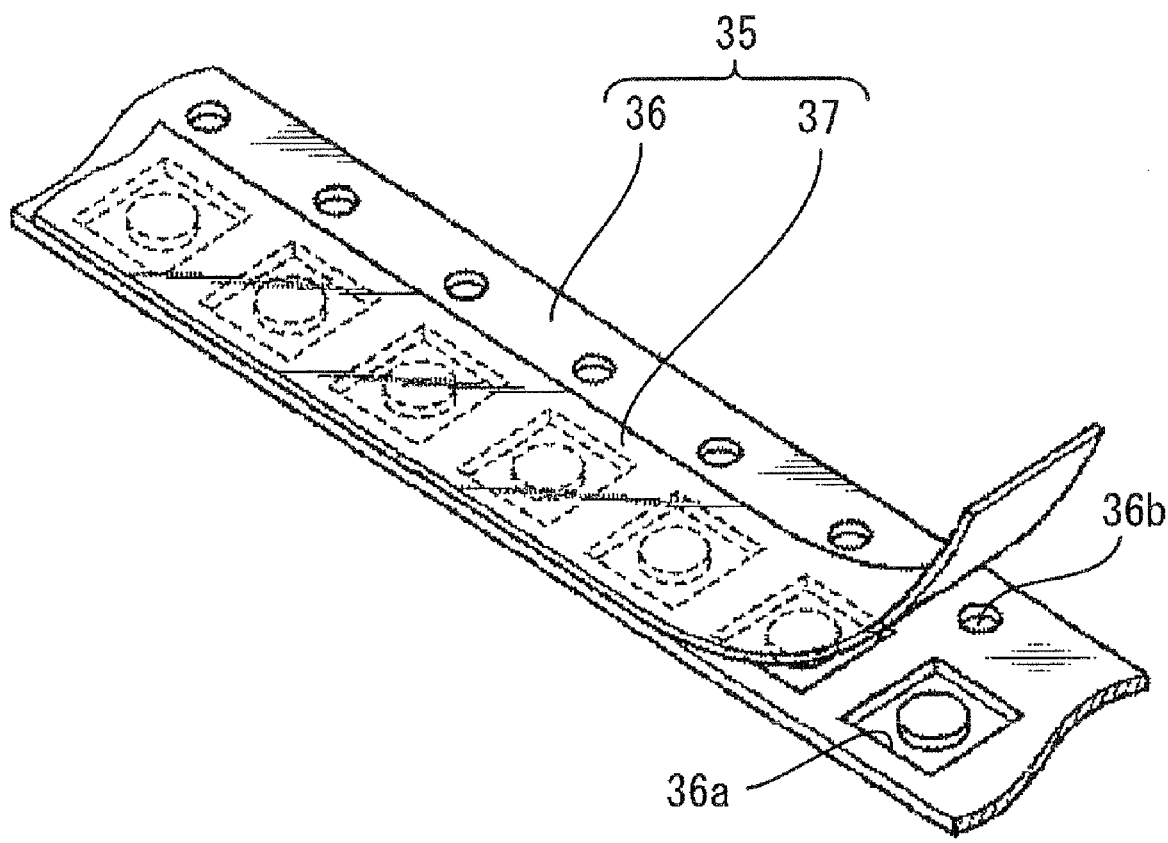
FIG. 3 is a perspective view of a component supply tape.

As shown in FIGS. 1 and 2, a surface mounter 10 comprises a conveyer 20 for conveying a printed circuit board P, a component supply zone 30 disposed on each of opposite lateral sides of the conveyer 20, and a head unit 25.

The component supply zone 30 is formed by positioning a plurality of component supply units 40 in a side-by-side arrangement, on a carriage Ds which is mounted to a body of the surface mounter 10 while being positioned in X, Y and Z directions.

The head unit 25 takes on a function of picking up a component from the component supply zone 30 and transferring the component onto the board P, wherein it is adapted to be movable in a region ranging from the component supply zone 30 to a mounting position on the board P, under driving of a drive mechanism using a servomotor or the like.

The head unit 25 includes a plurality of heads 26 each of which has a distal end provided with a suction nozzle for suction-holding a component and attaching the component to the printed circuit board P. Each of the nozzles is designed to receive a supply of a negative pressure from negative-pressure generating means (not shown) during a component suction-pickup operation, and pick up a component by a suction force based on the negative pressure.

The reference numeral 12 in FIG. 2 indicates a camera. The cameral 12 takes on a function of imaging a component suction-held by the head 26 to check whether a posture of the suction-held component is adequate.

In the surface mounter 10 configured as above, the head unit 25 is firstly moved to a position above an end of the component supply zone 30 on the side of the conveyer 20 to pick up components from the component supply unit 40. Then, after completion of the component pickup operation by the head 26, the presence or absence of misalignment in component pickup position is checked by the camera 12. Then, the picked-up components are transferred by the head unit 25. During the transfer operation, the misalignment in component pickup position is corrected with respect to each of the heads 26. Then, when the head 26 reaches a given component-attaching position, it is moved up and down, and the component is mounted onto the printed circuit board P according to the up-and-down movement.

2. Component Supply Unit

The component supply unit 40 is primarily made up of a feed-out device 51, a guide device 100, a take-in device 61, and a unit body 41 to which these devices are fixed, and designed to feed out an after-mentioned component supply tape 35 to supply components. The component supply tape 35 is fed out in a direction from a left side to a right side in FIG. 4, along a longitudinal direction of the component supply unit 40. In the following description, the longitudinal direction of the component supply unit 50 will be referred to as "frontward-rearward direction", and the terms "front" and "rear" concerning the component supply unit 40 will be used in accordance with a feed direction of the component supply tape 35. That is, in FIG. 4, the right side (side closer to the conveyer 20) is a front side, and the left side is a rear side.

The component supply tape 35 has a structure as shown in FIG. 3A, which comprises a carrier tape 36, and a cover tape 37 attached to the carrier tape 36. The carrier tape 36 has a plurality of cavity-like component storage portions 36a opened upwardly and arranged at constant intervals, and a component, such as IC, is stored in each of the component storage portions 36a. Further, the carrier tape 36 has a plurality of engagement holes 36 provided in one of opposite edge regions along an edge thereof at constant intervals. The component supply tape 35 is wound and supported by a reel (not shown) at a rearward position of the component supply unit 40.

Figure 4:
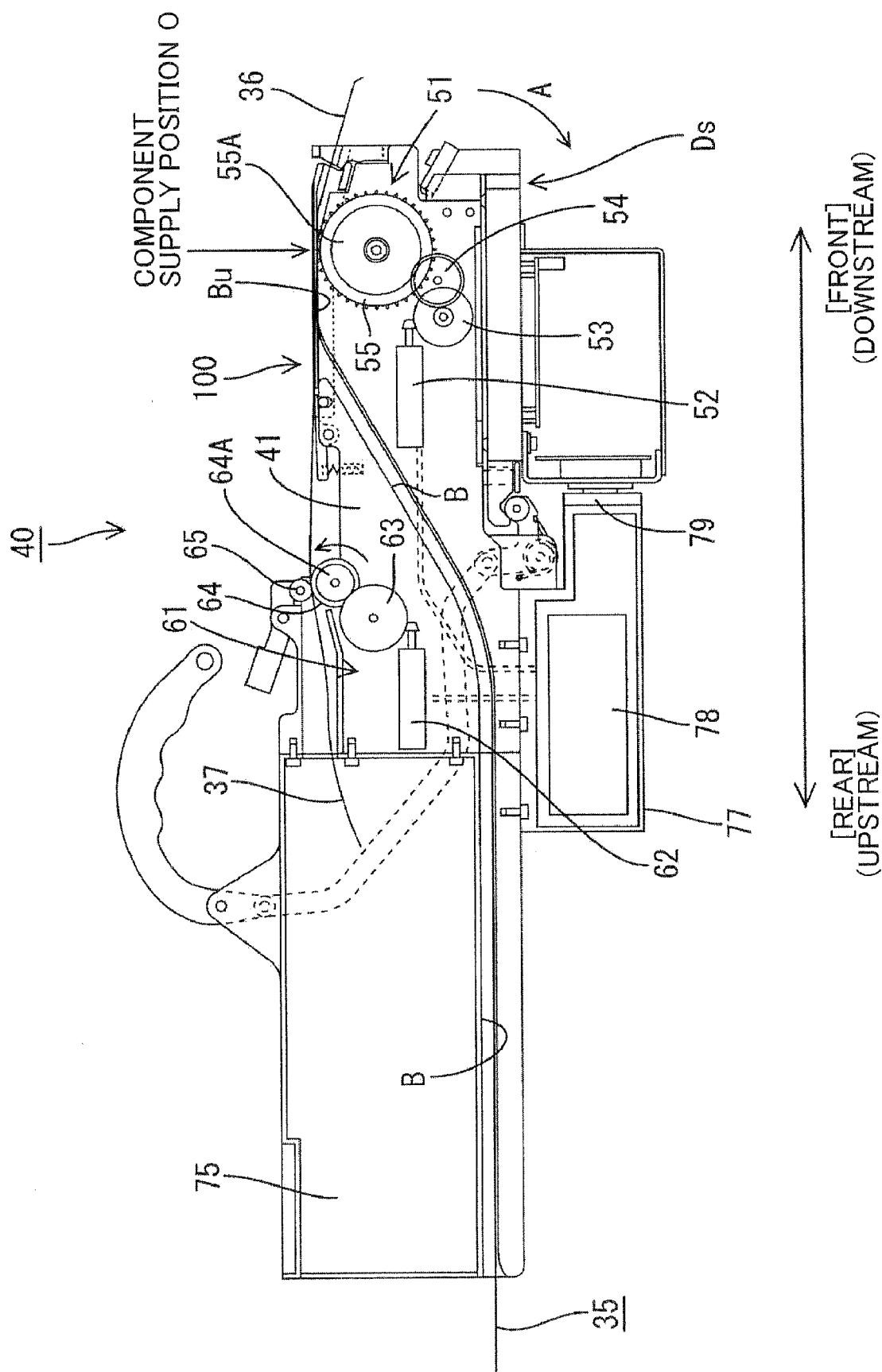
FIG. 4 is a side view showing an attached state of a component supply unit.

As shown in FIG. 4, the unit body 41 of the component supply unit 40 has a shape elongated in the frontward-rearward direction, and a housing 75 is installed to a rear end of the unit body 41. The unit body 41 and the housing 75 are provided with a feed path B for allowing the component supply tape 35 to travel therethrough. The feed path B extends frontwardly from a lower region of a rear end of the housing 75 straight and horizontally and connects to the unit body 41. Then, the feed path B extends to a position above a front portion of the unit body 41 while taking a route directed obliquely frontwardly, and then extends frontwardly along an upper side of the unit body 41. In the following description, a portion of the feed path B extending in the frontward-rearward direction along the upper side of the unit body 41 will be referred to as "upper feed path Bu".

The feed-out device 51 and the guide device 100 as will be described below are disposed on a frontward side of the unit body 41 with respect to the feed path B, and the take-in device 61 is provided on the other side with respect to the feed path B.

The feed-out device 51 takes on a function of allowing the component supply tape 35 to be unreeled from a reel (not shown), and comprises a first motor 52, a gear 53, a gear 54, a gear 55A, and a sprocket 55 integrated with the gear 55A. The sprocket 55 is disposed in an upper region of a front end of the unit body 41, and the gears 53, 54 and the first motor 52 are disposed below and rearward of the sprocket 55.

The guide device 100 will be described below. The guide device 100 comprises a tape guide 110 to be attached above the upper feed path Bu illustrated in FIG. 5, and a first retainer section 150 and a second retainer section 160 for supporting the tape guide 110.

The upper feed path Bu is formed along a top surface portion of a base member 43 provided in an upper end of the front portion of the unit body 41 to extend in a longitudinal direction of the base member 43. A portion of the base member 43 ranging from a rear end to a center thereof is formed as a flat portion 44 where a tape feed surface extends approximately horizontal. In the guide device 100 in the first embodiment, a component supply position O is positioned at a position on the side of a front end of the flat portion 44, and the tape being fed along the upper feed path Bu has a horizontal posture before it reaches the component supply position O, and then reaches the component supply position O while keeping the horizontal posture.

A portion of the base member 43 located frontward of the flat portion 44, i.e., frontward of the component supply position O, is formed as a downwardly-inclined portion 45 where the tape feed surface extends gently obliquely downwardly. A lateral edge portion of the base member 43 ranging from a front region of the flat portion 44 and a rear region of the downwardly-inclined portion 45 is cut out, so that a teeth portion of the sprocket 55 is exposed from the cutout. This makes it possible to allow teeth of the sprocket 55 to be engaged with the engagement holes 36b of the carrier tape 36 being fed on and along the upper feed portion Bu.

Further, a seat portion 46 is formed frontward of the downwardly-inclined portion 45. The seat portion 46 is formed to have a height position lower than that of the lower inclined portion 45 in order to receive an after-mentioned bottom wall 121 of the tape guide 110. Further, the base member 43 is provided with an escape groove 47 concaved along the longitudinal direction. The escape groove 47 is designed to avoid interference with the component storage portions 36a provided in the component supply tape 35.

The tape guide 110 will be described below. The tape guide 110 is made of a synthetic resin, and formed to have a shape which is generally elongated in one direction along the upper feed path Bu. The tape guide 110 is functionally divided into a front guide section 120 (which corresponds to "downstream guide section" in the appended claims), and a rear guide section 130 (which corresponds to "upstream guide section" in the appended claims).

The rear guide section 130 is formed in a cross-sectionally angular C shape having an opening oriented downwardly. More specifically, the rear guide section 130 has a shape where respective upper edges of a pair of sidewalls 112, 114 (which correspond to "pair of guide walls" in the appended claims) thereof are connected to each other by a ceiling wall 131. The rear guide section 130 is designed to guide the component supply tape 35 in a region upstream of the component supply position O in a tape feed direction to keep the component supply tape 35 in a normal posture.

Figure 11:
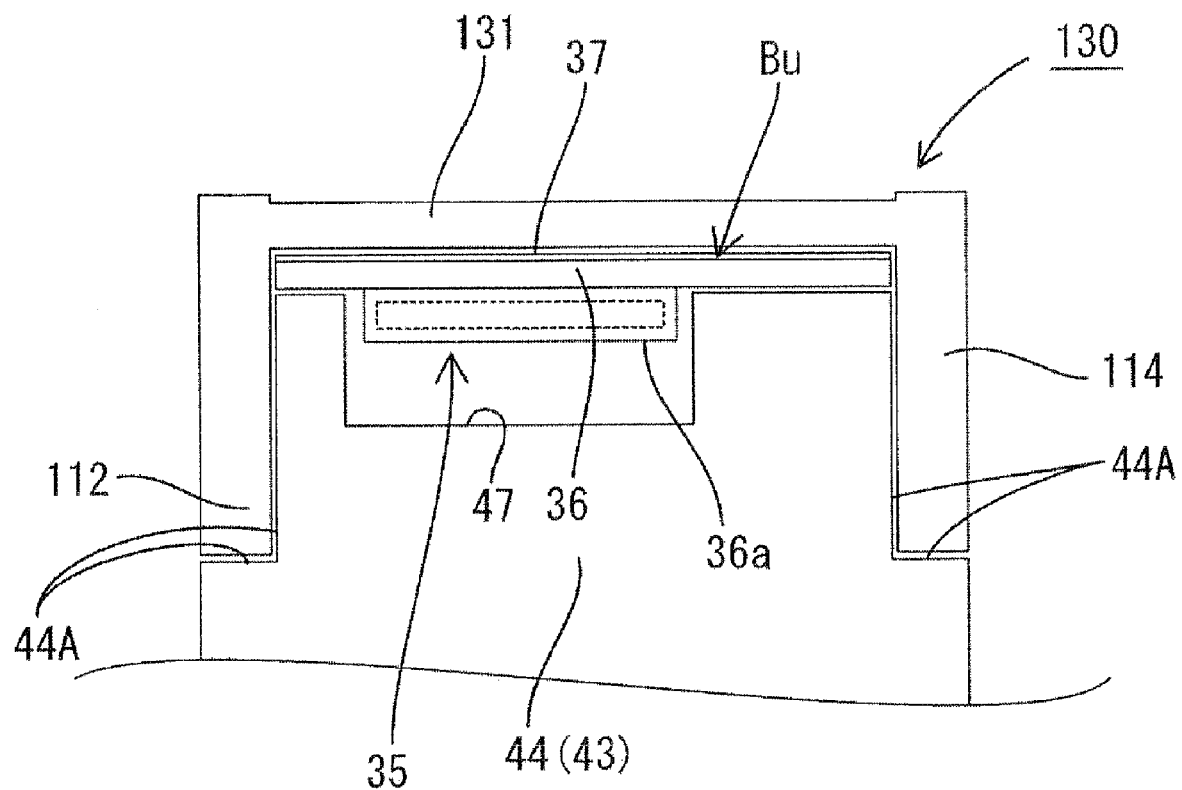
FIG. 11 is a sectional view taken along the line XI-XI in FIG. 7.

Specifically, as shown in FIG. 11, the flat portion 44 of the base member 43 has opposite shoulders each formed as a mounting seat 44A having a width equal to that of a corresponding one of the sidewalls 112, 114 of the rear guide section 130. Further, the rear guide section 130 is formed such that a width between respective wall surfaces of the right and left sidewalls 112, 114 becomes equal to a width of the flat portion 44 of the base member 43, whereby, during an attaching operation (see FIG. 11), each of the sidewalls 112, 114 of the rear guide section 130 is fitted on the respective mounting seats 44A without a gap therebetween.

Thus, in the fitted state, the sidewalls 112, 114 of the rear guide section 130 are gaplessly located on both sides of the upper feed path Bu formed in the top surface portion of the base member 43, to restrain a widthwise displacement of the component supply tape 35. In the first embodiment, the component supply tape 35 has a width set to be approximately equal to that of the flat portion 44 of the base member 43.

Figure 5:
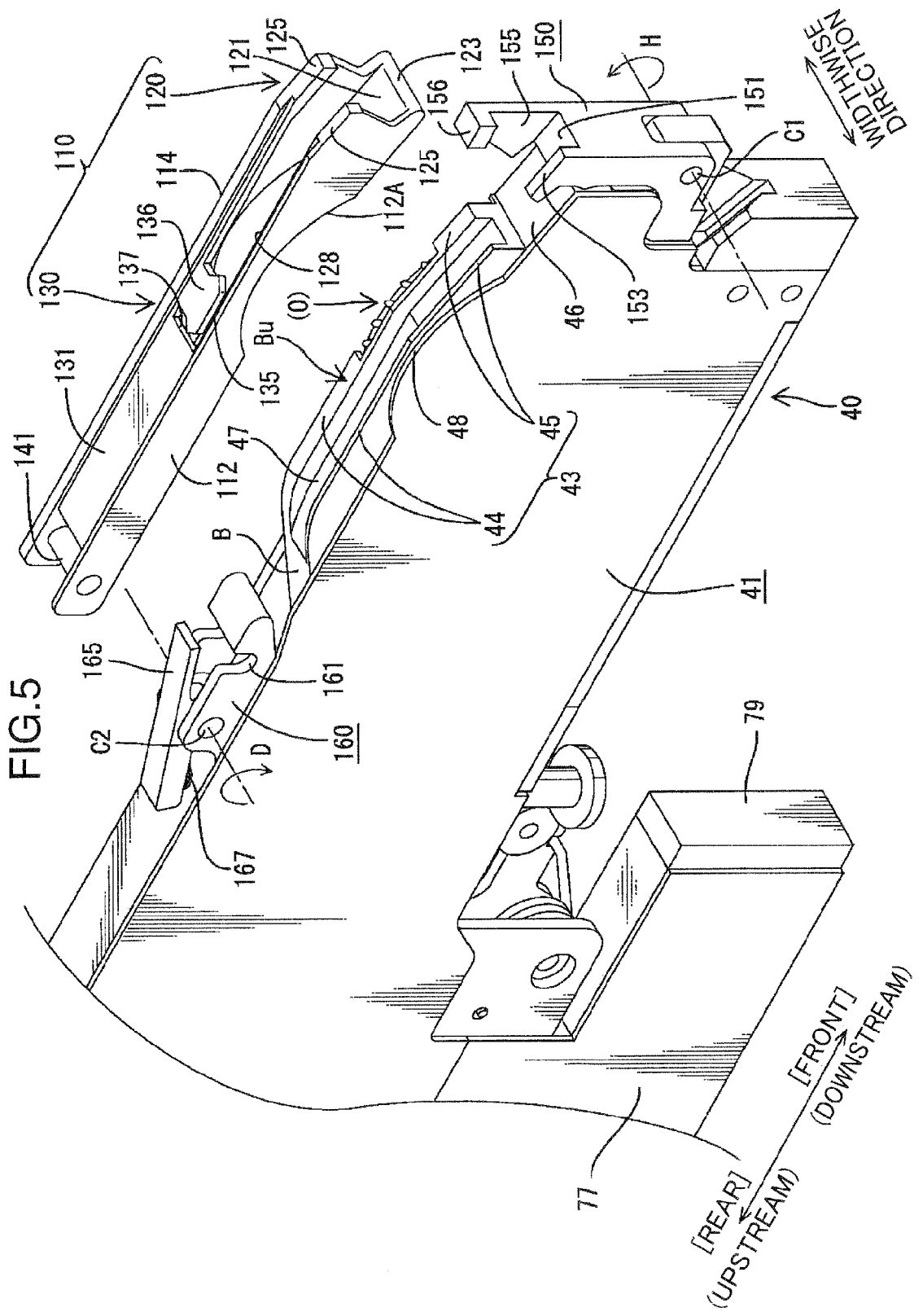
FIG. 5 is a perspective view of a front portion of the component supply unit (which shows a state after a guide device is detached therefrom).

As shown in FIG. 5, the tape guide 110 is further formed with a component-pressing portion 136 at a position frontward of the ceiling wall 131 of the rear guide section 130. The component-pressing portion 136 is divided from the ceiling wall 131 by a slit 135. The slit 135 has an L shape which has one side extending in a widthwise direction of the tape guide 110 and the other side extending in a longitudinal direction of the tape guide 110. The ceiling wall 131 has a front edge serving as a turnaround portion 137.

The turnaround portion 137 takes on a function of allowing the cover tape 37 to be turned in the rearward direction of the unit, and the component-pressing portion 136 is designed to cover a top surface of the component storage portion 36a of the carrier tape 36 during a course after the cover tape 37 is peeled off therefrom, through until the component storage portion 36a reaches the component supply position O, so as to restrain jump-out of a component.

The tape guide 110 further has a lock pin 141 provided at a position on the side of a rear end of the rear guide section 130 to bridge between the right and left sidewalls 112, 114. The lock pin 141 is adapted to be detachably retained by the second retainer section 160 as will be described later.

The front guide section 120 will be described below. The front guide section 120 is formed in a cross-sectionally angular C shape having an open ceiling. More specifically, the front guide section 120 has a shape where respective lower edges of right and left sidewalls 112, 114 thereof are connected to each other by a bottom wall 121.

A lower portion of the front guide section 120, i.e., the bottom wall 121, is formed in a shape corresponding to that of the seat portion 46, i.e., inclined slightly obliquely downwardly. Further, the front guide section 120 has a font end formed as an engagement portion 123. The engagement portion 123 is formed to protrude frontwardly, and adapted to be locked by after-mentioned lock pieces 153, 155 of the first retainer section 150.

Figure 12:
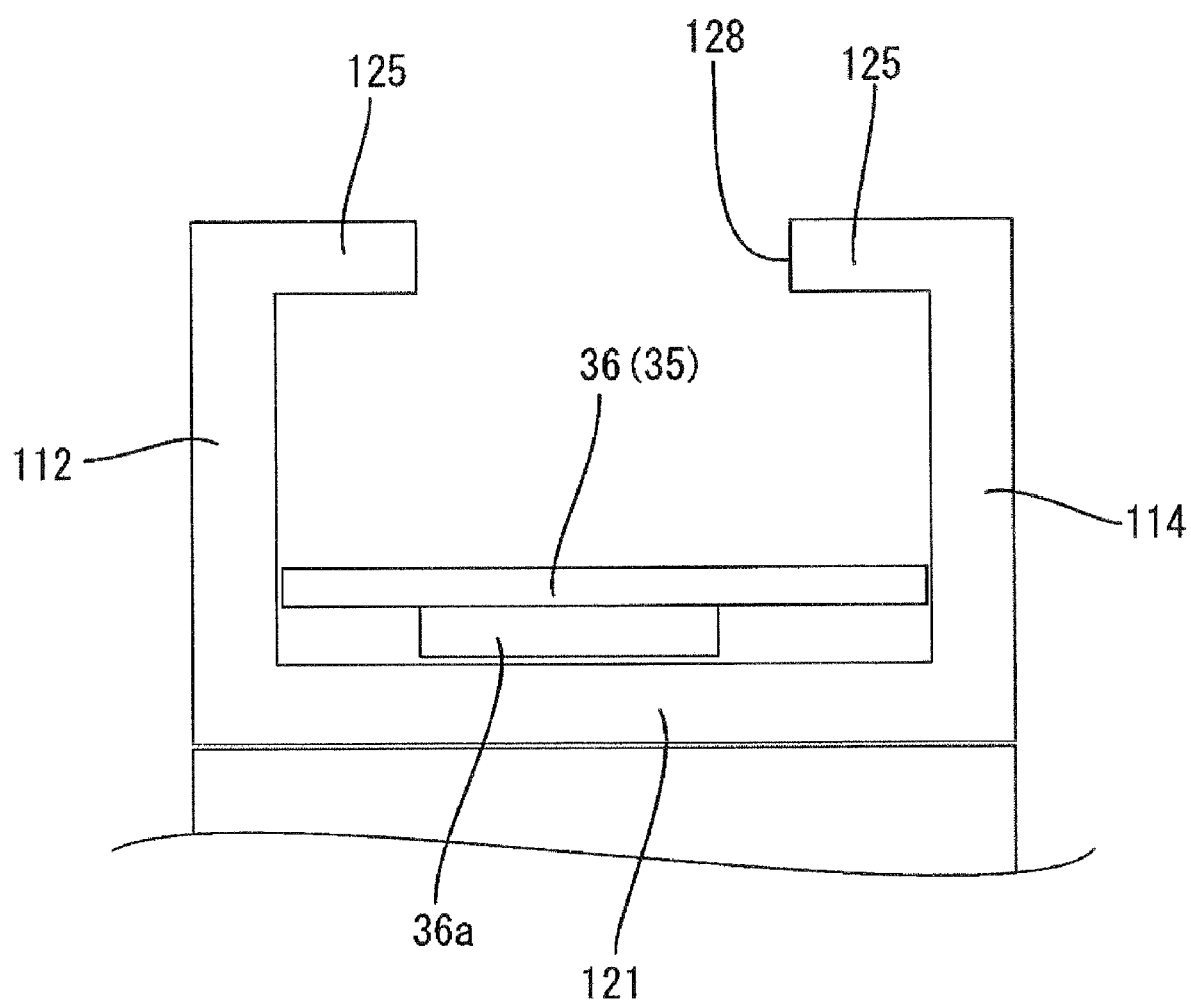
FIG. 12 is a sectional view taken along the line XII-XII in FIG. 7.

The front guide section 120 is designed to guide the component supply tape 35 in a region downstream of the component supply position O in the tape feed direction to keep the component supply tape 35 in the normal posture. Specifically, during a tape feed operation, the carrier tape 36 travels along an upper surface of the bottom wall 121, as shown in FIG. 12. Further, the sidewalls 112, 114 of the front guide section 120 are located on respective ones of widthwisely opposite sides of the carrier tape 36 to guide the component supply tape 35.

As shown in FIG. 5, the front guide section 120 has an opening formed in a top surface thereof to extend from the component-pressing portion 136 to a front end of the tape guide portion 110. This opening serves as an open surface 128 which is formed to continuously extend to a front opening provided in the front end of the tape guide 110 and have an approximately even width over the overall length thereof.

In this manner, the front guide section 120 is formed to have the open surface 128 opened on the side of the top surface thereof in a continuous manner in the tape feed direction (frontward-rearward direction). This makes it possible to perform a setting operation for the cover tape 37 (details of the setting operation will be described later) in a simple and easy manner. In the first embodiment, a rear end of the open surface 128 is communicated with the turnaround portion 137 through the slit 135.

As shown in FIGS. 5 and 12, an upper edge of each of the right and left sidewalls 112, 114 of the front guide section 120 is bent inwardly. This bent portion serves as a jump-out restraint wall 125 which takes on a function of restraining jump-out of the component supply tape 35 (carrier tape 36) traveling through the front guide section 120.

Although the front guide section 120 and the rear guide section 130 have been described separately, the respective sidewalls 112, 114 of the front and rear guide sections 120, 130 in the first embodiment are connected to each other, and thereby the front and rear guide sections 120, 130 are formed as a single component in their entirety.

Figure 6:
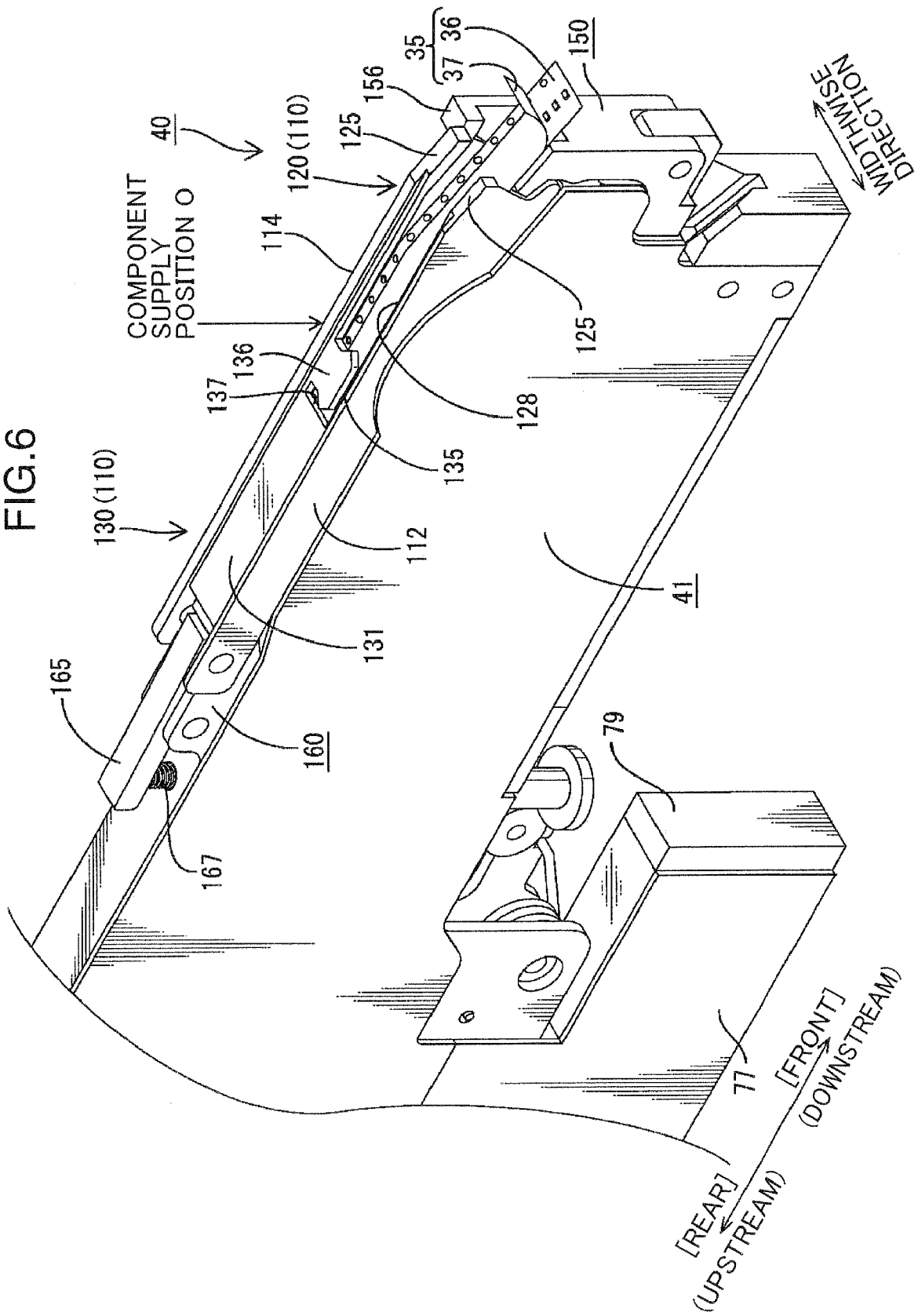
FIG. 6 is a perspective view of the front portion of the component supply unit (which shows a state before a cover tape is peeled off).

Each of the sidewalls 112, 114 of the tape guide 110 has a shape in side view as shown in FIGS. 5 and 6, which is conformable to an upper edge of the unit body 41. A portion of the unit body 41 providing a mating surface with the tape guide 110 has a rear region formed in a flat shape, and a front region (corresponding to the sprocket 55) formed to protrude in an arc shape. Thus, in conformity to the shape of the unit body 41, a lower edge of each of the sidewalls 112, 114 of the tape guide 110 has a rear region formed in a flat shape, and a front region cut out in an arc shape. In the following description, the protruding portion of the unit body 41, and the portion of the tape guide 110 corresponding to the protruding portion, will be referred to as "protruding portion 48" and "arc-shaped cutout portion 112A", respectively.

The first retainer section 150 will be described below. The first retainer section 150 is attached to the front end of the unit body 41 through a hinge C1, and biased in a locking direction (direction indicated by H in FIG. 5) by biasing means (not shown). The first retainer section 150 has a tape discharge passage 151 provided in an upper portion thereof, and a pair of lock pieces 153, 155 provided on respective opposite sides of the tape discharge passage 151. The lock pieces 153, 155 are designed to lock the engagement portion 123 provided at the front end of the tape guide 110.

In the lock pieces 153, 155, the lock piece 153 on a near side in FIG. 5 extends obliquely toward the seat portion 46 of the unit body 41. More specifically, the lock piece 153 extends obliquely while assuring a gap for receiving the engagement portion 123 therein, with respect to the seat portion 46. On the other hand, the lock piece on a back side juts upwardly while extending obliquely toward the seat portion 46. This upwardly-jutting portion is used as a manual operation portion 156.

The second retainer section 160 will be described below. The second retainer section 160 is provided rearward of the base member 43, and formed with a lock groove 161 having an axis extending in a widthwise direction of the component supply unit 40. The lock groove 161 is adapted to allow the lock pin 141 of the tape guide 110 to be inserted thereinto so as to retain the lock pin 141, and formed to be opened upwardly.

Further, the second retainer section 160 has a pressing piece 165 attached at a position thereof rearward of the lock groove 161. The pressing piece 165 is formed in a shape extending in the frontward-rearward direction of the component supply unit 40, and swingably attached through a hinge C2. The pressing piece 165 has a lock spring 167 provided at a rear end thereof to bias the pressing piece 165 in a locking direction (direction indicated by H in FIG. 5).

Thus, after the tape guide 110 is placed on the base member 43, front and rear portions of the tape guide 110 are locked by the first and second retainer sections 150, 160, so that the tape guide 110 is retained above the upper feed path Bu. Specifically, in the front portion of the tape guide 110, the lock pieces 153, 155 of the first retainer section 150 come into engagement with the engagement portion 123 at the front end of the tape guide 110 to lock the front portion of the tape guide 110. Further, in the rear portion of the tape guide 110, the pressing piece 165 presses the lock pin 141 toward a bottom of the lock groove 161 to lock the rear portion of the tape guide 110.

Figure 9:
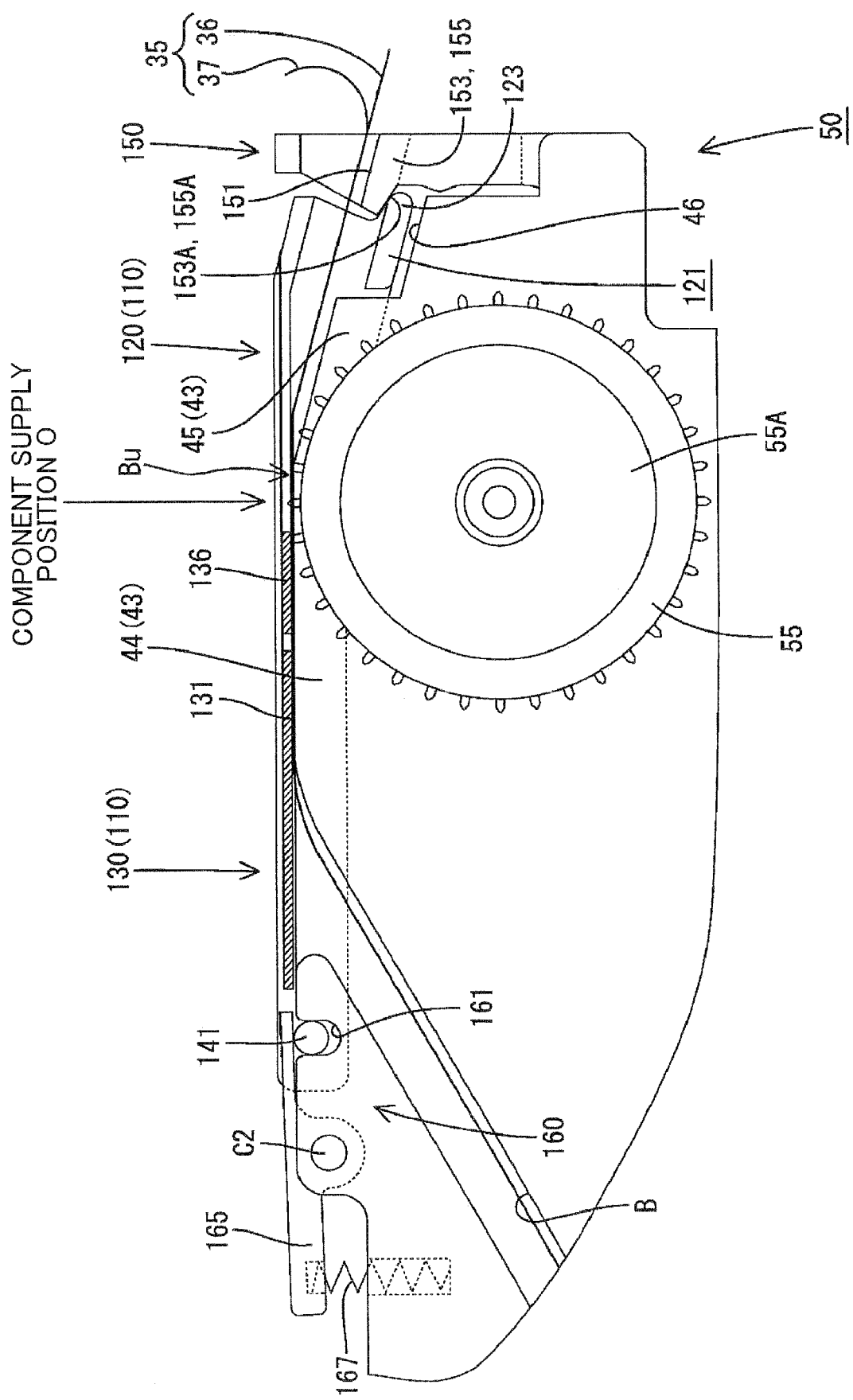
FIG. 9 is a side view of the front portion of the component supply unit (which shows a state after the component supply tape is pulled out from a front end of the unit).

An attached state of the tape guide 110 is shown in FIG. 9. In the attached state, the ceiling wall 131 of the tape guide 110 has a posture parallel to the flat portion 44 of the base member 43. The reason is as follows. When the lock pin 141 is pressed toward the bottom of the lock groove 161, the tape guide 110 is apt to be swingably moved, for example, about a vertex of the protruding portion 48 (FIG. 5), to cause lift of the front end thereof. However, the engagement portion 123 located in the front end is brought into contact with lower edges 153A, 155A of the lock pieces 153, 155, and thereby a vertical position of the front end of the tape guide 110 is restricted. Accordingly, the ceiling wall 131 of the table guide 110 is set in a horizontal posture.

In this manner, the ceiling wall 131 of the table guide 110 is kept in a horizontal posture, so that the component supply tape 35 in the course of feeding is pressed from thereabove and therebelow by the ceiling wall 131 of the table guide 110 and the flat portion 44 of the base member 43. This makes it possible to effectively restrain uplift and inclination of the tape during feeding.

In an operation of releasing the retention of the front end of the tape guide 110 by the first retainer section 150, the manual operation portion 156 may be manually pushed in the frontward direction of the unit, so that an entirety of the first retainer section 150 is tilted in the frontward direction of the unit to release the locked state. In an operation of releasing the retention of the rear end of the tape guide 110 by the second retainer section 160, the rear end of the pressing piece 165 may be pushed downwardly, so that restraint of the lock pin 141 is released, and consequently the locked state of the rear end of the tape guide 110 is released.

Returning to FIG. 4, the take-in device 61 will be described below. The take-in device 61 takes on a function of peeling off the cover tape 37 from the carrier tape 36 along with the feed-out of the component supply tape 35, to expose the components, and a function of taking in the peeled tape 37, and comprises a second motor 62, a gear 63, a gear 64A, a take-in roller 64 integrated with the gear 64A, and a pinch roller 65.

The pinch roller 65 and the take-in roller 64 are in close contact with each other, so that, in response to activation of the second motor 62, a force in a pulling direction is applied to the cover tape 37 turned in the rearward direction of the unit by the turnaround portion 137, based on a frictional force between the rollers 64, 65.

Further, a control board 78 of the component supply unit 40 is housed in a box 77 and disposed at a position below and on the side of the rear end of the unit body 41. A connector 79 is installed to a front end of the box 77. When the component supply unit 40 is attached to the carriage Ds, the connector at the end of the box 77 is electrically connected to a counterpart connector, so that electric power and various control signals are input from the surface mounter 10 through the carriage Ds. The control board 78 is designed to control/govern an entirety of the component supply unit 40, in cooperation with a control unit (not shown) of the surface mounter 10.

In the above component supply unit 40, the components are supplied in the following manner.

Upon activation of the first motor 52, a driving force of the first motor 52 is transmitted to the sprocket 55 via the gear 53, the gear 54 and the gear 55A, and the sprocket 55 starts rotating.

Thus, the component supply tape 35 is unreeled from the reel (not shown). The component supply tape 35 travels toward the front portion of the component supply unit 40 through the feed path B, and eventually reaches the upper feed path Bu.

When the component supply tape 35 after reaching the upper feed path Bu passes through the turnaround portion 137, the cover tape 37 is peeled off by the take-in device 61. Subsequently, only the carrier tape 36 is fed through the upper feed path Bu toward the component supply position O.

A portion of the carrier tape 36 subjected to the cover-tape peeling operation is fed under a condition that an upper side of each of the component storage portions 36*a* is covered by the component-pressing portion 136 of the tape guide 110, and then the component within the component storage portion 36*a* is exposed after passing through the component-pressing portion 136.

Subsequently, the component storage portion 36*a* of the carrier tape 36 reaches the component supply position O. In the component supply position O, the exposed component is picked up by the head 26 of the surface mounter 10. Then, the portion of the carrier tape 36 subjected to the component pickup operation is discharged outside the unit through the downwardly-inclined portion 45, the bottom wall 121 of the tape guide 110, and the tape discharge passage 151 of the first retainer section 150. Concurrently, the peeled cover tape 37 is taken in in the rearward direction of the unit by the take-in device 61, and received in an internal space of the housing 75.

Once the component supply operation is initiated, the component supply tape 35 is unreeled at constant intervals in the aforementioned manner, so that the components are sequentially fed to the component supply position O.

3. Replacement Operation

A tape setting operation will be described below which is to be performed when the reel (not shown) having the component supply tape 35 wound therearound is replaced.

When the reel is replaced, the component supply tape 35 has to be set to the unit body 41 of the component supply unit 40. In this operation, the component supply tape 35 is pulled out from the reel (not shown) by a certain length. Then, the component supply tape 35 is manually inserted into the feed path B from the rear end of the housing 75.

Figure 8:
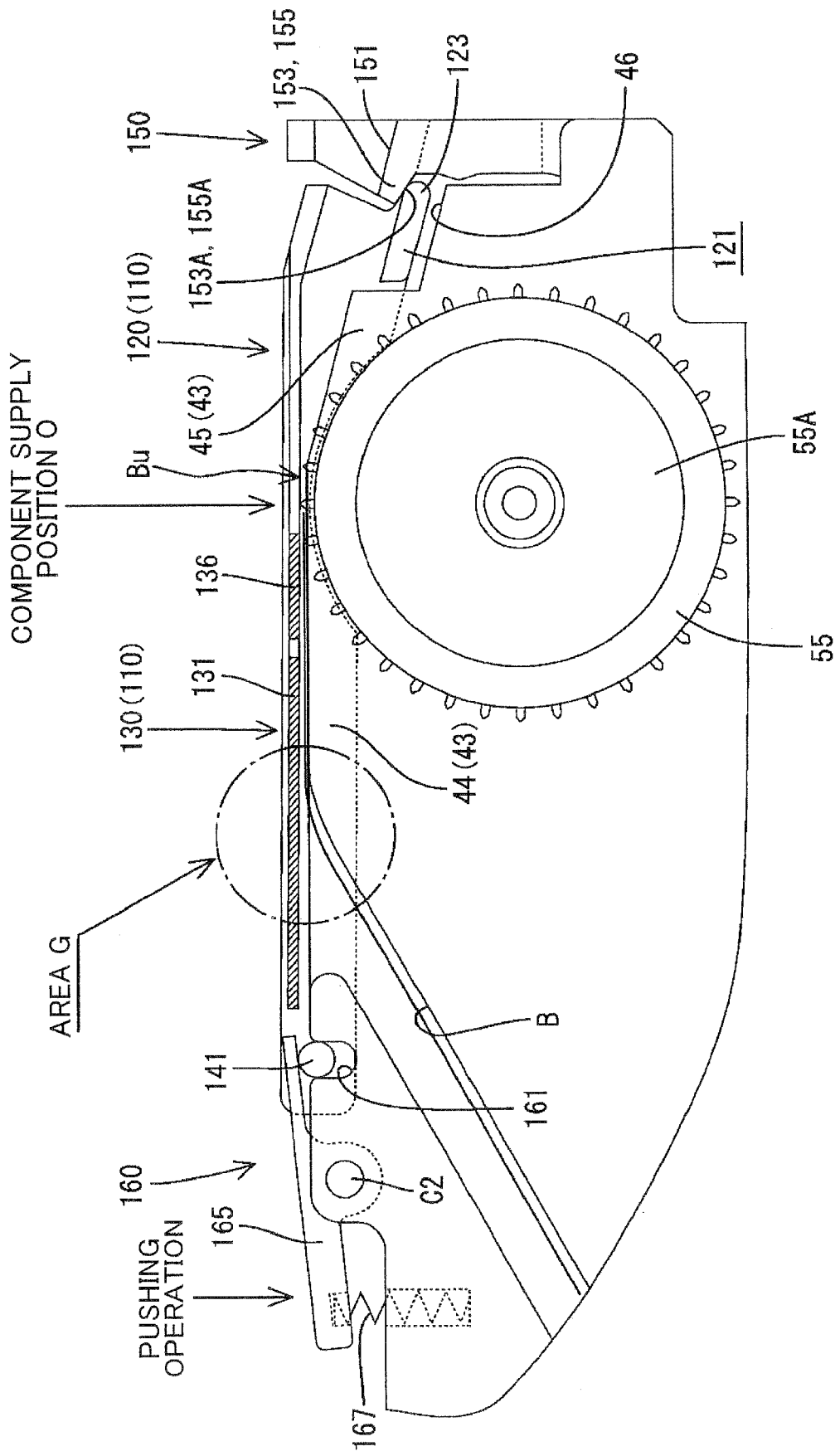
FIG. 8 is a side view of the front portion of the component supply unit (which shows a state after a rear end of a tape guide is lifted).

After the component supply tape 35 is inserted into the feed path B to some extent, the rear end of the pressing piece 165 of the second retainer section 160 is then pushed downwardly to allow the pressed state of the lock pin 141 by the front end of the pressing piece 165 to be released, as shown in FIG. 8. Through this operation, the restraint of the rear end of the tape guide 110 is released, and thereby the tape guide 110 has an inclined posture in which the rear end of the tape guide 110 is slightly lifted, so that a gap for allowing the component supply tape 35 to be inserted into the upper feed path Bu is created between the flat portion 44 of the base member 43 and the ceiling wall 131 of the tape guide 110.

After creating the gap through the above operation, a leading edge of the component supply tape 35 is manually fed out in the frontward direction of the unit, via the rear guide section 130, the front guide section 120 and the tape discharge passage 151 in this order, so as to allow the component supply tape 35 to be pulled out from a front end of the component supply unit 40 to an outside of the component supply unit 40 (see FIGS. 6 and 9).

After completion of the pull-out operation for the component supply tape 35, a leading edge of the cover tape 37 is then manually pulled to peel off the cover tape 37 from the carrier tape 36 by a given length. Subsequently, the leading edge of the peeled cover tape 37 is manually pinched and pulled in the rearward direction of the unit along the open surface 128.

Figure 7:
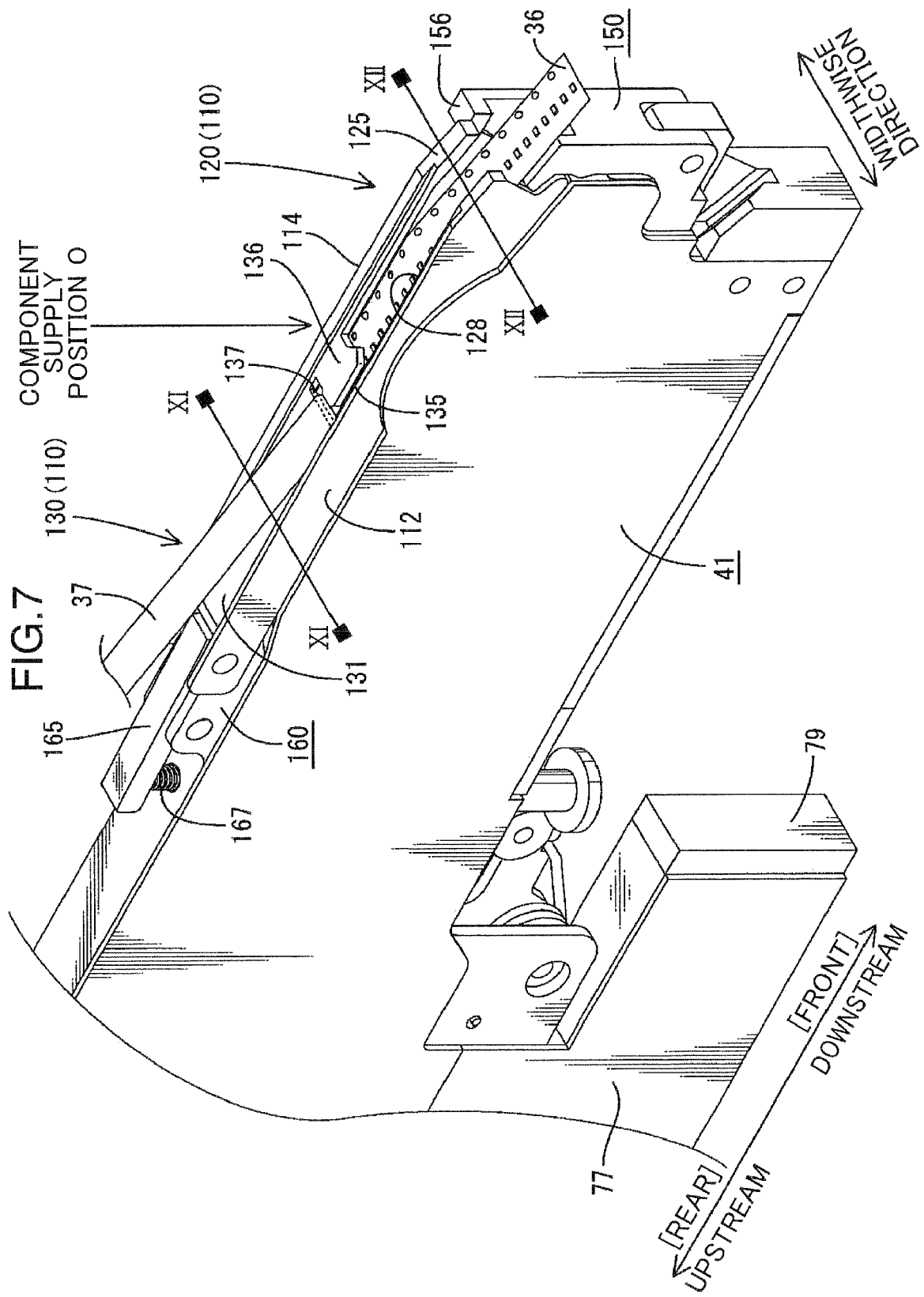
FIG. 7 is a perspective view of the front portion of the component supply unit (which shows a state after the cover tape is set to a turnaround portion).
Figure 10:
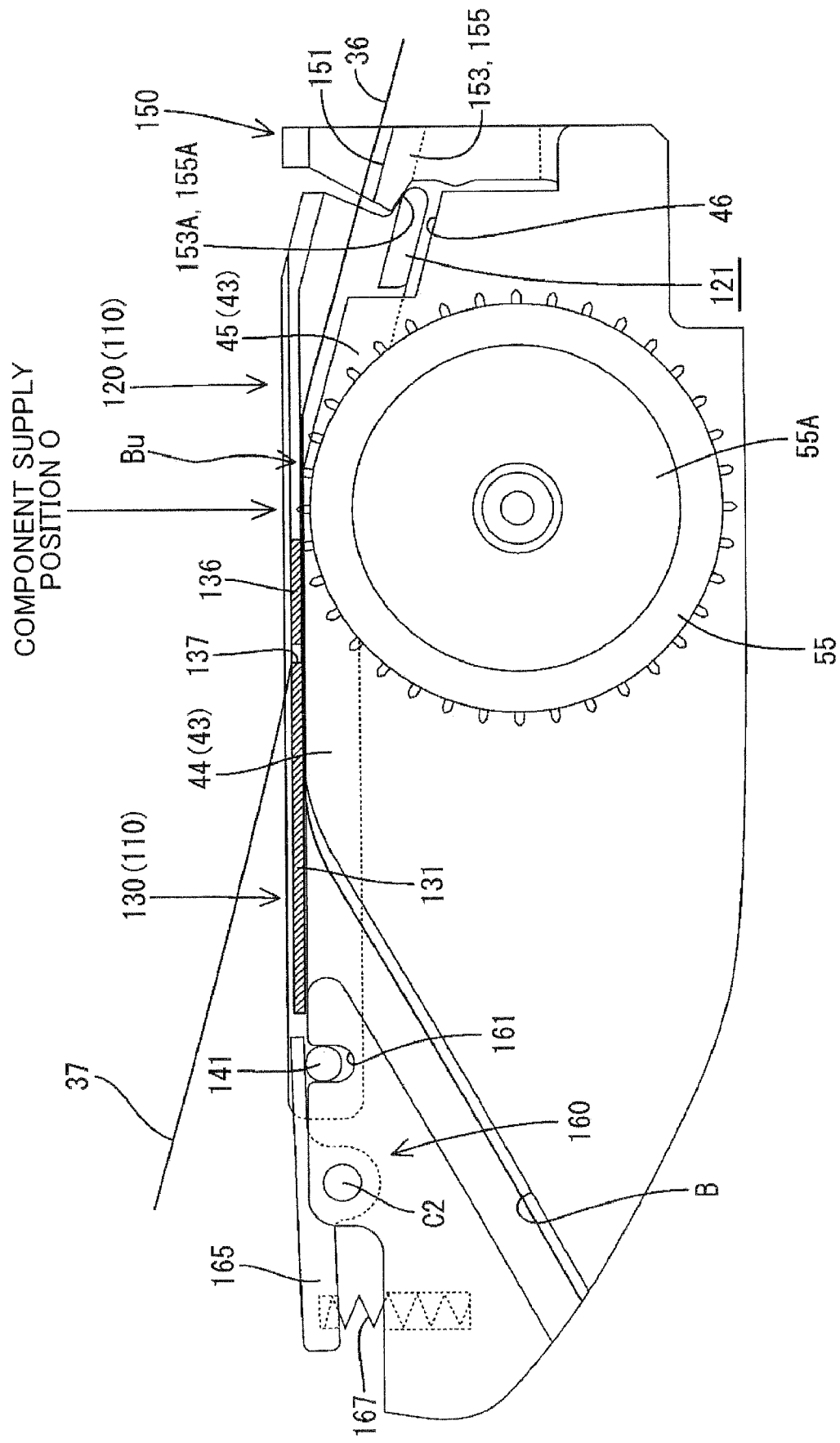
FIG. 10 is a side view of the front portion of the component supply unit (which shows a state when the cover tape is turned rearwardly through the turnaround portion).

Through this operation, only the cover tape 37 can be pulled back in the rearward direction of the unit along the open surface 128 while leaving the carrier tape 36 within the front guide section 120. Subsequently, the pulled-back cover tape 37 is set to the turnaround portion 132 through the slit 135 (FIGS. 7 and 10). In advance of this operation, the pressing piece 165 of the second retainer section 160 may be pushed in the release direction to set the rear end of the tape guide 110 in a slightly lifted posture, in the same manner as that in the operation of inserting the component supply tape 35 into the upper feed path. This makes it possible to more smoothly perform the operation of setting the cover tape 37 to the turnaround portion 132 (an operation of inserting the cover tape 37 into the slit 135).

After the cover tape 37 is set to the turnaround portion 137 in the above manner, the cover tape 37 is arranged to allow the leading edge thereof to be held between the two rollers 64, 65 of the take-in device 61, and the carrier tape 36 is arranged to allow the engagement holes 36a thereof to be engaged with the teeth of the sprocket 55. Now, the tape setting operation is completed to achieve a state allowing for component supply.

4. Advantages

In the first embodiment, the front guide section 120 is provided with the open surface 128 opened on the side of the top surface thereof in a continuous manner in the tape feed direction, whereby the cover tape 37 can be freely taken in and out relative to the front guide section 120 through the open surface 128. In this configuration, under the condition that the tape guide 110 remains fixed above the upper feed path Bu, the setting operation for the cover tape 37 can be performed through the aforementioned given operational steps. This makes it possible to perform the setting operation for the cover tape 37, in a simple and efficient manner.

The open surface 128 is formed in the front guide section 120 in the above manner. Thus, even if the component drops onto the upper feed path Bu due to the occurrence of pickup miss during the component supply operation, the dropped component is effectively kept from lodging inside the front guide section 120. Further, the open surface 128 is opened upwardly. Thus, even if the lodging of the component occurs, the lodged component can be readily removed through the upwardly-opened open surface 128.

In an ordinary approach, the strength of the front guide section 120 is ensured by connecting the right and left sidewalls 112, 114 through a ceiling wall. In contrast, in the first embodiment, such a ceiling wall is omitted to form the open surface 128. Although this may raise concern about deterioration in the strength, the same level of stiffness as that of a structure devoid of the open surface 128 can be ensured, because, in the first embodiment, the bottom wall 121 is provided to connect respective lower portions of the sidewalls 112, 114.

In the first embodiment, the rear guide section 130 is further provided upstream of the component supply position O, wherein the rear guide section 130 and the front guide section 120 are adapted to guide the component supply tape 35 on opposite rearward and frontward sides of the component supply position O. This configuration makes it possible to more reliably guide the tape as compared with a case where the component supply tape 35 is guided on only one of the rearward and frontward sides.

In the first embodiment, the ceiling wall 131 is provided in the rear guide section 130, wherein the front edge of the ceiling wall 137 is formed as the turnaround portion 137, and the component-pressing portion 136 is provided frontward of the turnaround portion 137 and adapted to press an upper surface of the component supply tape 35 (carrier tape 36) in the state after the cover tape 37 is peeled off therefrom. This configuration makes it possible to allow the cover tape 37 to be turned in direction in a simple and rational structure, and restrain jump-out of the components from the carrier tape 36.

Further, the front guide section 120 and the rear guide section 130 are integrally formed. This configuration makes it possible to reduce the number of structural members, which provides superiority in regard to cost.

Furthermore, the tape guide 110 is configured such that the front end thereof is lockable by the first retainer section 150, and the rear end thereof is lockable by the second retainer section 160. A locked state in each of the ends can be released by a simple manual operation, to facilitate detaching and replacing the tape guide 110.

Second Embodiment

A second embodiment of the present invention will be described below.

Figure 13:
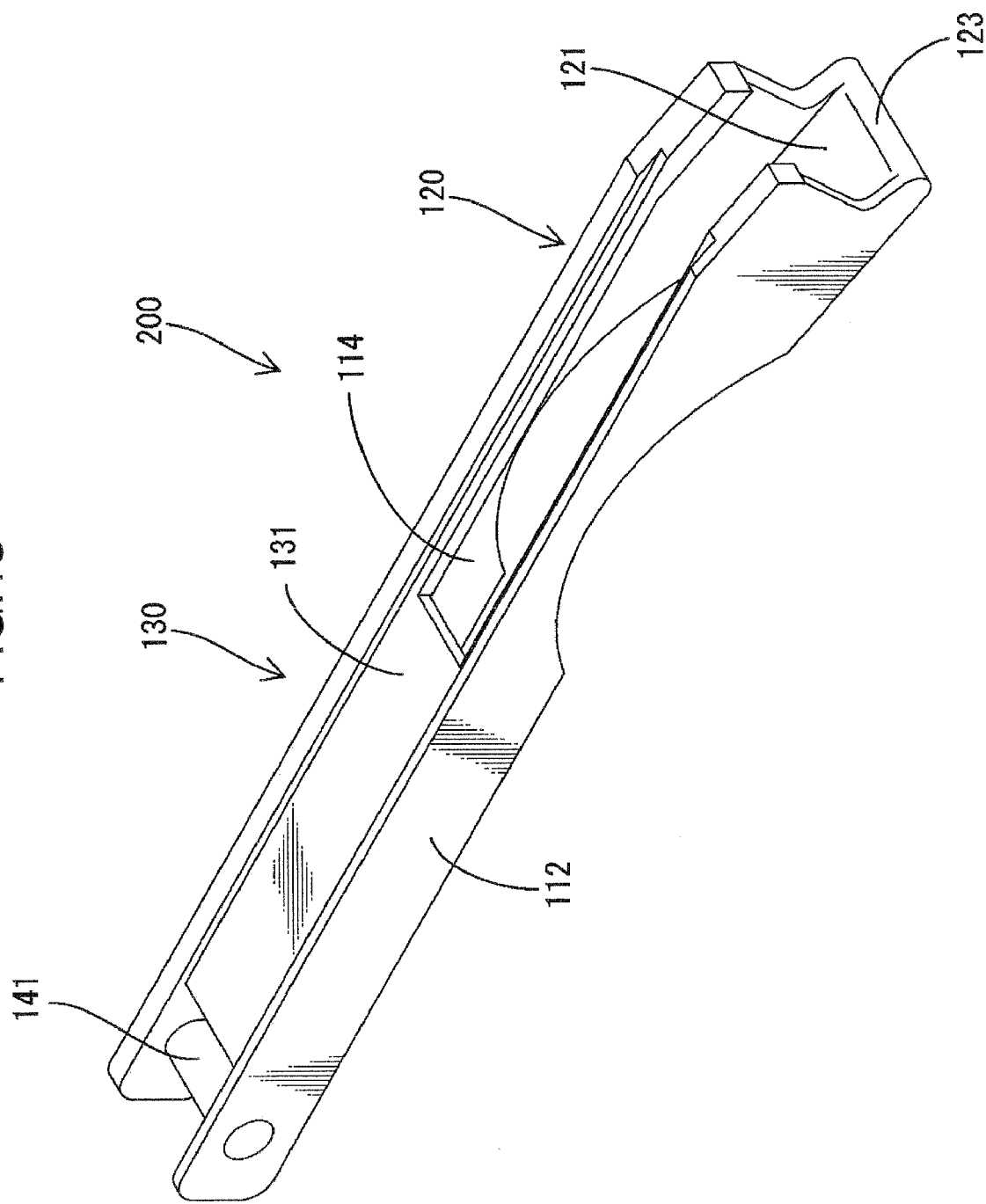
FIG. 13 is a perspective view of a tape guide used in a second embodiment.

The tape guide 110 in the first embodiment is provided with the component-pressing portion 136, whereas the component-pressing portion 136 is eliminated in the second embodiment. Specifically, a tape guide 200 in the second embodiment has a shape as shown in FIG. 13, wherein the remaining portion other than the component-pressing portion 136 has the same shape as that in the first embodiment.

The component-pressing portion 136 is intended to restrain jump-out of the components after the tape peeling operation. Thus, in cases where there is no risk of jump-out of the components after the peeling operation, it is not essential to provide the component-pressing portion 136, but it may be rather advantageous to avoid setup of the component-pressing portion 136 (e.g., in case where a process of removing static charges is performed after the peeling operation).

Thus, both the tape guide 110 in the first embodiment and the tape guide 200 in the second embodiment may be prepared. In this case, either one of the tape guides 110, 200 can be selectively used depending on the situation.

In the above case, when the tape guide 200 (110) is retained relative to the upper end of the front portion of the unit body 41 (retained above the upper feed path Bu) under the condition that it is locked by the first retainer section 150 and the second retainer section 160, the tape guide 200 (110) can be readily detached from the unit body 41 by releasing the locked state thereof. Then, when the tape guide 200 (110) is attached to the unit body 41, the tape guide 200 (110) can be readily fixed to the unit body 41 by simply retaining front and rear ends of the tape guide 200 (110) using the first retainer section 150 and the second retainer section 160. In this manner, the replacement operation can be performed relatively easily. This is also advantageous.

Third Embodiment

Figure 14:
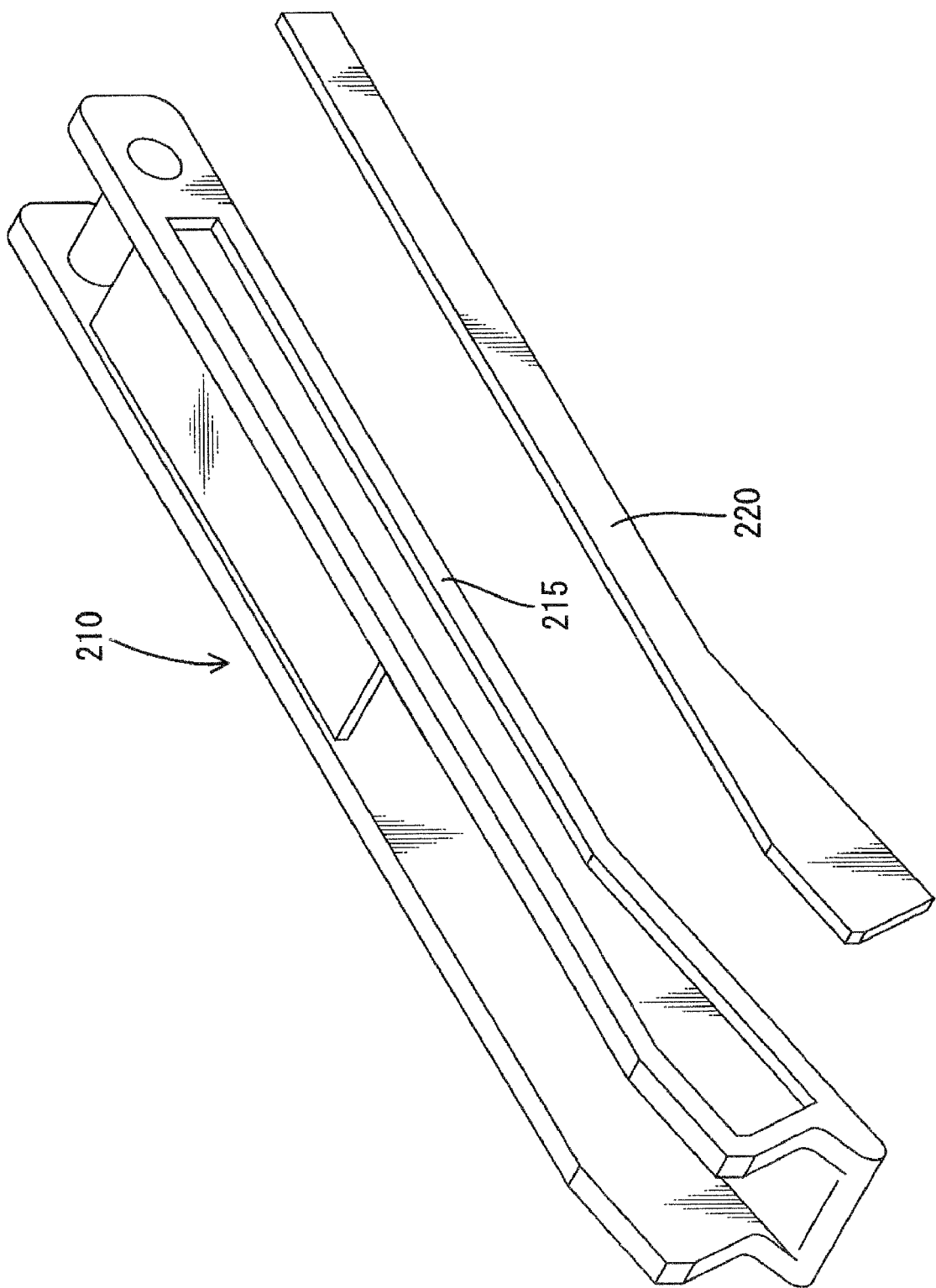
FIG. 14 is a perspective view of a tape guide used in a third embodiment.

A third embodiment of the present invention will be described below. The tape guide 110 in the first embodiment is made of a resin material, whereas a tape guide in the third embodiment is a reinforced type thereof. The tape guide in the third embodiment has a shape as shown in FIG. 14, wherein a metal reinforcing plate 220 is laminated on each of right and left sidewalls 215 of a resin tape-guide body 210 by a bonding process or an integral molding process.

Other Embodiments

The present invention is not limited to the above embodiments described and illustrated in the figures. For example, the following embodiments are also includes in the technical scope of the present invention, and various changes and modifications may further be made therein without departing from the scope of the present invention.

(1) Although the first to third embodiments have been described based on one example where the component supply unit 40 is an electrically-driven type using a motor as a driving source, the component supply unit in the present invention is not limited to this type. For example, the present invention may be applied to a ratchet type.

(2) Although, in the first to third embodiments, a ceiling wall of the front guide section 120 is omitted to form the open surface 128 opened on the top surface of the front guide section 120, a position for forming the open surface 128 is not limited to the top surface of the front guide section 120. For example, the open surface may be provided in any suitable position having no negative effect on a guide function, e.g., in the sidewalls 112, 114.

(3) Although the first to third embodiments have been described based on one example where the front guide section 120 and the rear guide section 130 are integrally formed, it is not essential to form the two guide sections 120, 130 as a single member. For example, as shown in FIG. 15, the front guide section 120 and the rear guide section 130 may be formed as separate members.

In this case, the front guide section 120 may be directly fixed to the seat portion 46 of the unit body 41 using a fastener, such as a screw. Alternatively, the front guide section 120 may be integrally formed with the unit body 41. This makes it possible to effectively prevent an increase in the number of structural members.

On the other hand, the rear guide section 130 is preferably fixed in such a manner that a rear end thereof is pivotally supported by the unit body 41 through a lock pin 141 (which corresponds to "pin member" in the appended claims), and a front end 138 thereof is locked relative to the unit body 41 through a locking device (capable of locking the front end and releasing the locked state thereof according to given manual operations) (not shown). In this configuration, when the locked state of the front end 138 is released, the rear guide section 130 can be manually opened upwardly to facilitate the operation of inserting the component supply tape 35 into the upper feed path Bu.

(4) If there is an appropriate gap between the tape guide 110 and the base member 43 when the component supply tape 35 is replaced, the operation of inserting the component supply tape 35 into the upper feed path Bu can be facilitated to provide enhanced operational efficiency. In regard to this point, although the component supply unit in the first embodiment is configured such that the retention of the rear end of the tape guide 110 is released to lift the rear end so as to create a gap (indicated in the area G in FIG. 8) between the tape guide 110 and the upper feed path Bu, a position for releasing the retention of the tape guide 110 is not limited to the rear end, but the retention of the front end may be released.

Specifically, the component supply unit in the first embodiment is configured such that the front end of the tape guide 110 is retained by the first retainer section 150. Thus, the locked state of the front end by the first retainer section 150 can be readily released by pushing the manual operation portion 156 in the frontward direction of the unit. Then, the front end of the tape guide 110 can be lifted to ensure an appropriate gap between the tape guide 110 and the base member 43 in the same manner as that in the first embodiment, so as to allow the component supply tape 35 to be inserted into the upper feed path Bu without difficulty. After the component supply tape 35 is inserted into the upper feed path Bu, the tape guide 110 can be readily fixed by returning the first retainer section 150 to its original upstanding posture (the posture illustrated in FIG. 8).

In the last place, elements of the present invention disclosed based on the above embodiments and advantages thereof will be described in a summarized manner.

The present invention provides a component supply unit, which comprises: a feed-out device adapted to intermittently feed out a component supply tape toward a component supply position provided on a feed path extending in a given direction, wherein the component supply tape includes a carrier tape having components stored therein at constant intervals, and a cover tape attached to the carrier tape to prevent jump-out of the stored components; a guide device set up along the feed path and adapted to guide the component supply tape from widthwisely opposite sides thereof to keep a feed posture of the component supply tape in a normal posture; a turnaround portion set up above the feed path; and a take-in device adapted to take in the cover tape turned through the turnaround portion to peel off the cover tape from the carrier tape, during a course of feeding the component supply tape, wherein the guide device includes a downstream guide section located downstream of the component supply position in a tape feed direction and adapted to guide the component supply tape, and wherein the downstream guide section is provided with an open surface opened on one side thereof in a continuous manner in the tape feed direction, whereby the cover tape can be taken in and out relative to the downstream guide section through the open surface.

In the present invention, the downstream guide section is provided with an open surface opened on one side thereof in a continuous manner in the tape feed direction, whereby the cover tape can be taken in and out relative to the downstream guide section through the open surface. This configuration makes it possible to perform a cover tape setting operation through given operational steps, under a condition that the downstream guide section remains fixed to the component supply unit, so as to save time and effort for the operation.

The following configurations are preferable as an embodiment of the present invention.

When the downstream guide section has a pair of guide walls located on the widthwisely opposite sides of the component supply tape, the open surface is formed in a top surface between the pair of guide walls. The open surface opened upwardly provides enhanced operational efficiency.

The downstream guide section is configured to have a bottom wall connecting respective lower portions of the pair of guide walls. This configuration makes it possible to ensure proper strength.

The downstream guide section is integrally provided in a unit body of the component supply unit. This configuration makes it possible to reduce the number of structural members.

The component supply unit includes an upstream guide section located upstream of the component supply position in the tape feed direction and adapted to guide the component supply tape, wherein the upstream guide section and the downstream guide section are adapted to guide the component supply tape on opposite rearward and frontward sides of the component supply position. This configuration makes it possible to more reliably guide the component supply tape to keep the component supply tape in the normal posture.

When the upstream guide section has a pair of guide walls adapted to guide the component supply tape from the widthwisely opposite sides thereof, the upstream guide section is configured to have a ceiling wall connecting respective upper portions of the guide walls, wherein a front edge of the ceiling wall serves as the turnaround portion.

Further, the upstream guide section is configured to have a component-pressing portion provided frontward of the turnaround portion and adapted to press an upper surface of the component supply tape in a state after the cover tape is peeled off therefrom. These configurations make it possible to allow the cover tape to be turned in direction, and restrain jump-out of the components from the carrier tape, in a simple and rational structure.

The upstream guide section has, in a longitudinal direction thereof, one end pivotally supported by the unit body of the component supply unit through a pin member, and the other end locked relative to the unit body through a locking device, wherein the upstream guide section is adapted to be manually opened upwardly about the pin member after releasing a locked state thereof by the locking device. This configuration makes it possible to facilitate a setting operation for the component supply tape.

The upstream guide section and the downstream guide section are integrally formed. This configuration makes it possible to reduce the number of structural members, which is advantageous in regard to management and cost thereof. In addition, the integrated member is increased in stiffness so as to more reliably guide the tape.

The invention claimed is:

1. A component supply unit comprising:
  a feed-out device adapted to intermittently feed out a component supply tape toward a component supply position provided on a feed path extending in a given direction, the component supply tape including a carrier tape having components stored therein at constant intervals, and a cover tape attached to the carrier tape to prevent jump-out of the stored components;
  a guide device set up along the feed path and adapted to guide the component supply tape from widthwisely opposite sides thereof to keep a feed posture of the component supply tape in a normal posture;
  a turnaround portion set up above the feed path; and
  a take-in device adapted to take in the cover tape turned through the turnaround portion to peel off the cover tape from the carrier tape, during a course of feeding the component supply tape,
  wherein the guide device includes a downstream guide section located downstream of the component supply position in a tape feed direction and adapted to guide the component supply tape, and an upstream guide section located upstream of the component supply position in the tape feed direction and adapted to guide the component supply tape, the downstream guide section and the upstream guide section being formed integrally;
  the downstream guide section includes a pair of first guide walls located on the widthwisely opposite sides of the component supply tape; a bottom wall connecting respective lower portions of the pair of first guide walls; and an open surface formed as an opening in a top surface between the pair of first guide walls and formed in a continuous manner in the tape feed direction, whereby the cover tape can be taken in and out relative to the downstream guide section through the open surface; and
  the upstream guide section includes a pair of second guide walls located on the widthwisely opposite sides of the component supply tape; a ceiling wall connecting respective upper portions of the second guide walls; and an opening formed in a bottom surface between the pair of second guide walls.

2. The component supply unit as defined in claim 1, wherein a front edge of the ceiling wall of the upstream guide section serves as the turnaround portion.

3. The component supply unit as defined in claim 1, wherein the upstream guide section has a component-pressing portion provided frontward of the turnaround portion and adapted to press an upper surface of the component supply tape in a state after the cover tape is peeled off therefrom.

4. A surface mounter comprising: the component supply unit as defined in claim 1, and a head unit adapted to pick up the component supplied from the component supply unit and to mount the components on a board.

5. The component supply unit as defined in claim 1, wherein the component-pressing portion is divided from the turnaround portion by a L-shaped slit, a rear end of the open surface of the downstream guide section being communicated with the turnaround portion through the slit.

* * * * *